United States Patent
Gaksch et al.

(10) Patent No.: US 7,415,072 B2
(45) Date of Patent: Aug. 19, 2008

(54) DRIVE CONTROL FOR AN ELECTRIC DRIVE WITH A SECURE ELECTRICAL SEPARATION OF POWER ELEMENT AND CONTROL ELEMENT

(75) Inventors: Susanne Gaksch, Erlangen (DE); Kurt Göpfrich, Erlangen (DE); Peter Heidrich, Nürnberg (DE); Franz Imrich, Erlangen (DE); Peter Jänicke, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 840 days.

(21) Appl. No.: 10/398,087

(22) PCT Filed: Sep. 17, 2001

(86) PCT No.: PCT/DE01/03575

§ 371 (c)(1),
(2), (4) Date: Mar. 31, 2003

(87) PCT Pub. No.: WO02/27913

PCT Pub. Date: Apr. 4, 2002

(65) Prior Publication Data
US 2004/0080885 A1 Apr. 29, 2004

(30) Foreign Application Priority Data
Sep. 29, 2000 (DE) .................. 100 48 353 U

(51) Int. Cl.
*H04B 3/00* (2006.01)
*H04L 25/00* (2006.01)

(52) U.S. Cl. .......... 375/257; 375/256; 375/361; 361/62; 363/21.07

(58) Field of Classification Search .......... 375/256, 375/257, 361; 361/62; 363/21.07
See application file for complete search history.

(56) References Cited

U.S. PATENT DOCUMENTS
5,446,765 A * 8/1995 Leger .................. 375/359
5,699,609 A 12/1997 Wieloch ............. 29/830

FOREIGN PATENT DOCUMENTS
DE 41 36 514 A 5/1993
DE 196 37 580 A 3/1998
EP 0 747 914 A 12/1996

OTHER PUBLICATIONS
Biswas S K et al.: "Gate Drive Methods for Igbts in Bridge Configurations" Conference Record of the Industry Applications Conference. Denver Oct. 2-5, 1994, vol. 2 Conf. 29, Oct. 2, 1994, pp. 1310-1316, XP000512513 ISBN: 0-7803-1994-X, figures 2,3.

\* cited by examiner

*Primary Examiner*—Ted Wang
(74) *Attorney, Agent, or Firm*—Henry M. Feiereisen; Ursula B. Day

(57) ABSTRACT

The invention relates to a drive control for an electric drive with a secure electrical separation of power element and control element. The aim of the invention is to reduce the number of components such as optic couplers and buffer amplifiers between the power element and a control electronics. To this end, a suitable electrical transformer (U) is inserted in a digital communication interface (K) between the control unit (R) and the control electronics (A) for the purpose of providing a secure electrical separation. To make use of a transformer (U) possible, a non-zero frequency encoding, for example a Manchester encoding, is carried out. Alternatively, an Ethernet physics can be used to provide a suitable communication interface. The transformer electrically insulates the two communication paths from each other that are provided in an Ethernet physics and preferably has little coupling capacity and a low attenuation factor.

22 Claims, 2 Drawing Sheets

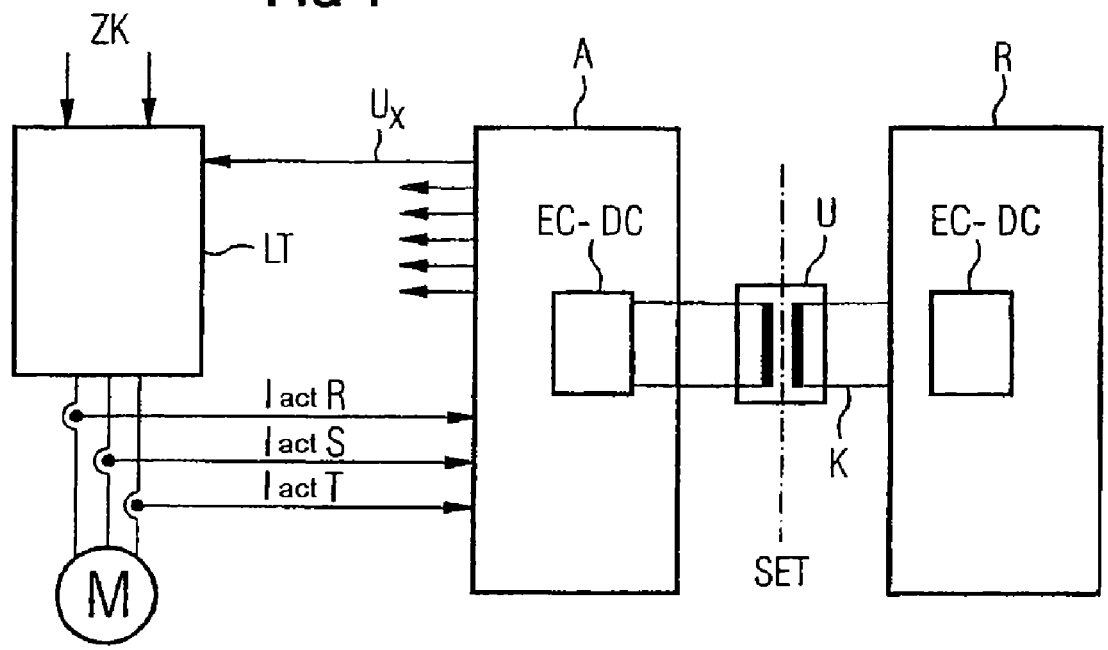
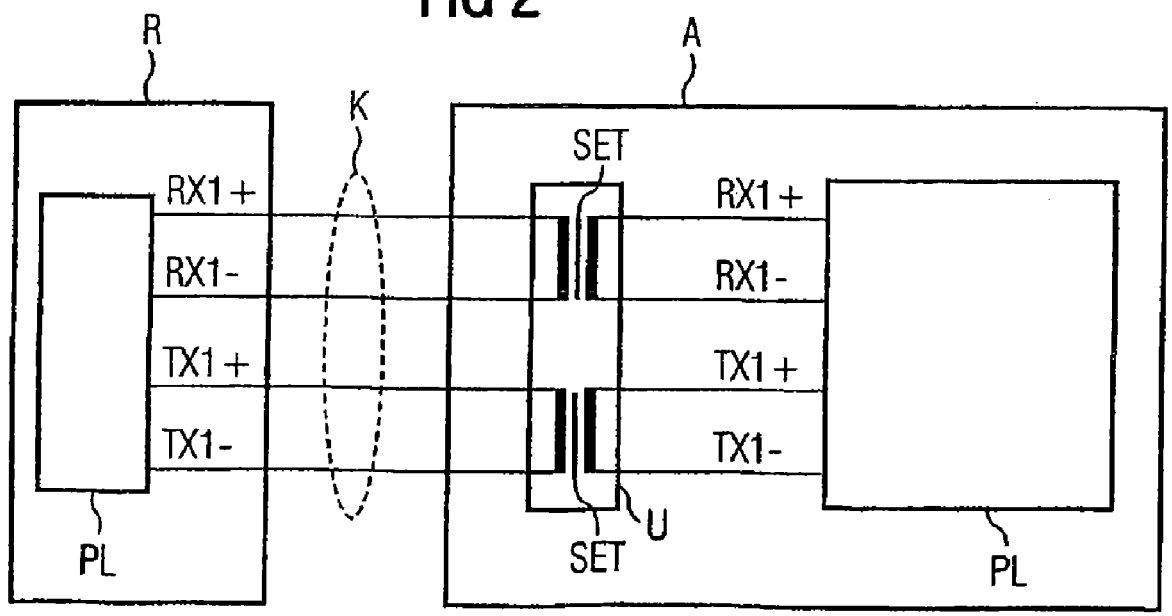

DRIVE CONTROL FOR AN ELECTRIC DRIVE WITH A SECURE ELECTRICAL SEPARATION OF POWER ELEMENT AND CONTROL ELEMENT

BACKGROUND OF THE INVENTION

The invention relates to a drive control system for an electrical drive having a power section which is at a comparatively high electrical potential, having drive electronics which supply the power section with drive signals, and which receives phase current actual values from this power section, and having a control unit which is at a comparatively low electrical potential and is connected to the drive electronics via a digital communications interface, with DC isolation between the power section and the control unit.

For safety reasons, the high-voltage side of the power section (up to 720 volts) must be safely electrically isolated from the low-voltage side of the control unit (generally approximately 5 volts) in a drive control system such as this. DC isolation is required at some point for this purpose, with the relevant Standards requiring an air gap and creepage distance of, for example, 8 mm. To achieve this, the electrical components which are used must comply with the requirements in these specific Standards.

Present-day solutions for such safe electrical isolation provide this isolation between drive electronics and the power section. A known arrangement of a drive control system such as this is illustrated in the form of a block diagram in FIG. 3.

The power section LT draws its power from an intermediate circuit ZK of a converter (not shown), and provides the three phase voltages for driving a motor M. The drive electronics A produce six drive signals Ux via six respective optocouplers OK (for the sake of clarity, only one such optocoupler is shown by way of example), which are used for driving current valves which are arranged in the power section, in particular a bridge circuit for IGBT transistors. In addition, a further path Ubr such as this may be required for driving a braking chopper.

The respective phase current actual values IactR, IactS, IactT in the three phases R, S, T of the motor M are measured, and are passed via respective isolating amplifiers TV to the drive electronics. In individual cases, only two isolating amplifiers are also provided, since the current in the third phase can be obtained from the two detected phase current actual values. In addition, an isolating amplifier TV is required for detecting the intermediate-circuit voltage Uzk. The drive electronics are connected to the control unit R via a communication interface K.

Thus, according to the prior art, the six or seven (with the braking chopper) optocouplers OK and the isolating amplifiers TV must comply with the requirements for safe electrical isolation. Components such as these are comparatively expensive, as a result of which the fact that a large number of these components that have been mentioned are required means that this approach is highly costly.

SUMMARY OF THE INVENTION

The object of the present invention is thus to provide a simpler and hence lower-cost drive control system for an electrical drive with safe electrical isolation between the power section and the control unit.

According to the present invention, this object is achieved by developing a drive control system of the type mentioned initially such that the DC isolation is provided solely by connecting a suitable electrical transformer in the communication interface between the control unit and the drive electronics.

The transformer is in this case preferably designed such that the DC isolation which is ensured by the electrical transformer complies with the requirements for safe electrical isolation.

It is often also necessary to allow bidirectional transmission. To achieve this, a solution is proposed with components based on the Ethernet Standard, as is widely used for office communication, with the digital communication interface being designed on the basis of Ethernet physics, with the transformer providing DC isolation for both of the communication paths which are provided using Ethernet physics.

In this case, it has been found to be advantageous for the transformer to be integrated in the drive electronics.

Ethernet therefore does not allow bidirectional transmission to be provided via one channel, and two separate channels are required, associated with increased complexity. A further restriction is that the transformer for Ethernet does not, as standard, ensure adequate interference immunity against rapid voltage rates of change (du/dt), in particular does not ensure safe isolation for voltages above 720 V. For this reason, a suitable transformer which complies with these requirements is provided as an extra item according to the invention.

A further advantageous refinement of the drive control system for an electrical drive according to the invention is distinguished in that a coder is provided for coding a binary data stream without any DC component at the transmission end, by which means the coded data stream can be transmitted via the digital communication interface to the electrical transformer and having a decoder for decoding the data stream at the reception end.

This allows binary information to be transmitted between the control unit and the drive electronics, with the occurrence of DC components being avoided in the data stream via the communication interface, which the transformer would not be able to process.

In this case, it has been found to be advantageous for the coder at the transmission end to be able to produce synthetic signal changes by transmitting binary values of the data stream as a defined sequence of signal changes, and for the decoder to be able to recover the original binary values of the data stream by associating the associated binary values with the sequences of signal changes arriving at the reception end.

It is particularly advantageous in this case for the coder and decoder to carry out Manchester coding, since a large number of low-cost standard components are available for this purpose.

A serial communication interface for transmission can be provided by the particularly low level of complexity on the basis of the invention, in which case transmission can be carried out using the half-duplex mode.

In order to allow synchronous digital communication between the control unit and the drive electronics with a data signal and a clock signal, it has been found to be advantageous for the coder to be used for logically linking the data signal and clock signal at the transmission end such that a coded data signal without any DC component results, which can be transmitted via a first communication path through the communication interface. A second communication path through the communication interface is then used for transmitting the clock signal, and the electrical transformer is designed such that it provides DC isolation for both communication paths, in which case the decoder can recover the original data signal at the reception end by once again logically linking the coded data signal and the clock signal.

In order to avoid delay time differences between the data signal and the clock signal, it is recommended that the means for coding and decoding the clock signal use the same logical linking with a constant binary value, and that it be possible to transmit the coded clock signal via the second communication path.

This can be achieved particularly simply and hence at low cost if the coder is used for exclusive-OR linking of the data signal and clock signal at the transmission end, and the decoder is used for renewed exclusive-OR linking of the coded data signal and clock signal at the reception end.

According to the invention, for the clock signal and in order to avoid different delay times, the coder can then be used for exclusive-OR linking of the clock signal with a constant binary value, in particular with the value zero, at the transmission end, in which case the clock signal coded in this way can be transmitted via the second communication path, and in which case the decoder can carry out renewed exclusive-OR linking of the coded clock signal and of the same constant binary value, in particular with the value zero, at the reception end.

It is to be found to be advantageous for all these measures for a transformer to be provided which has a low coupling capacitance between its primary circuit and its secondary circuit, in particular having a coupling capacitance of less than 1 pF.

Furthermore, a low-damping transformer should advantageously be provided, in particular in order to process high transmission data rates which can be achieved on the basis of Ethernet physics.

Further advantages and details of the present invention will become evident from the exemplary embodiment described in the following text and in conjunction with the figures. In this case, elements having the same functionality are identified by the same reference symbols. In the figures:

BRIEF DESCRIPTION OF THE DRAWING

FIG. 1 shows a block diagram of a drive control system with simple and safe electrical isolation according to the invention, FIG. 2 shows a block diagram of a drive control system as shown in the FIG., based on Ethernet physics.

DETAILED DESCRIPTION OF PREFERRED EMBODIMENTS

Figure 3:
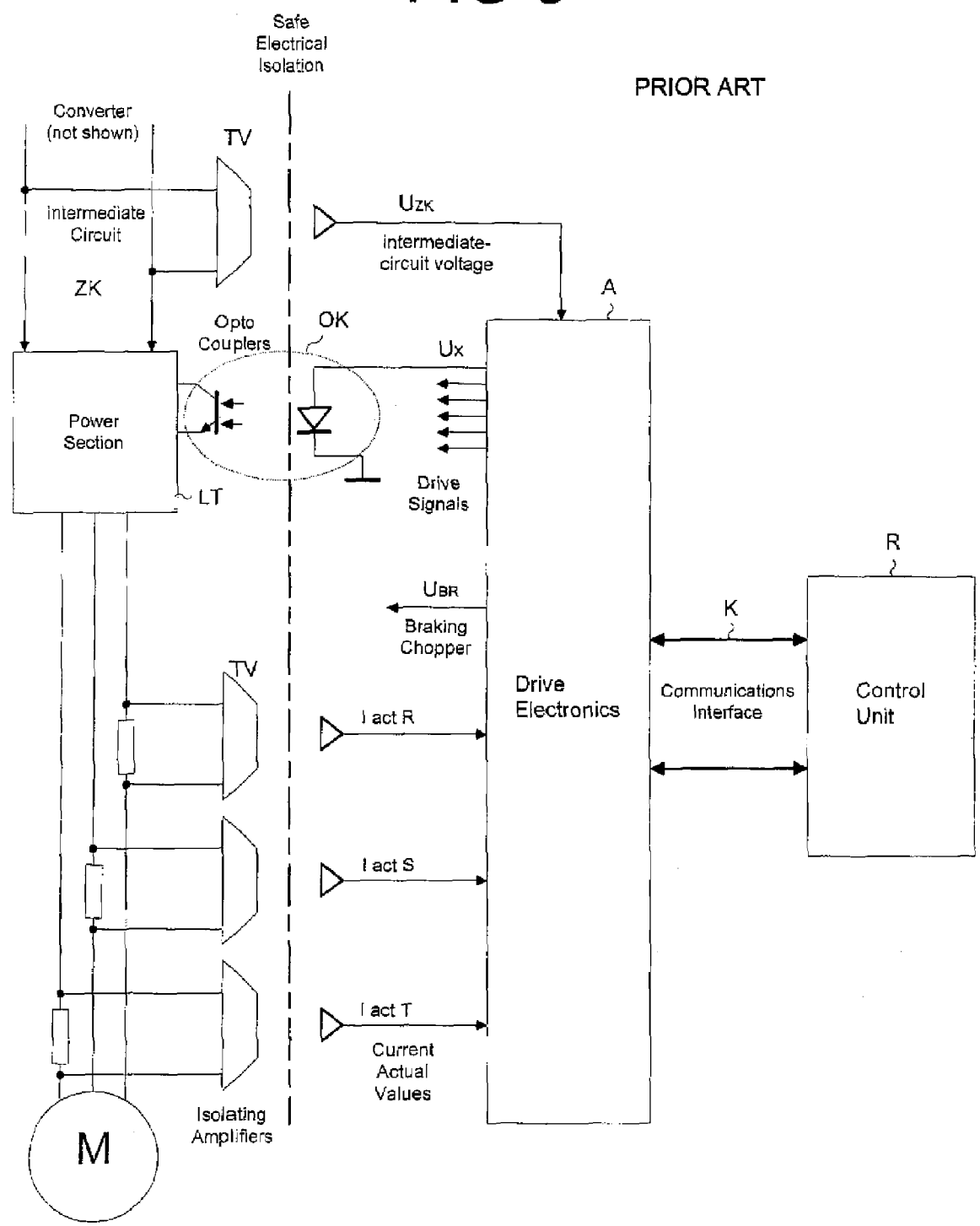
FIG. 3 shows a block diagram of a drive control system with safe electrical isolation based on the prior art.

The illustration in FIG. 1 shows a block diagram of a drive control system with simple and safe electrical isolation according to the invention. The arrangement corresponds essentially to that according to the prior art as shown in FIG. 3, as has already been described in the introduction. The critical difference according to the invention is that the communication interface K has a transformer U, which provides the safe electrical isolation SET.

The communication methods explained in the following text allow DC isolation of the data lines in the communication interface K, and thus make it possible to move the safe electrical isolation SET to the communication interface K.

This means that there is no need for the number of expensive optocouplers OK and isolating amplifiers TV as are required according to the prior art in FIG. 3. Since only functional isolation is now required between the high-voltage side and the low-voltage side, an air gap and creepage distance of only 4 mm, for example, is now required. This makes it possible to achieve considerable cost savings.

According to the invention, the data stream is first of all preprocessed in a suitable manner and is then transmitted via the transformer U. This transformer should have a very low coupling capacitance between the primary and secondary sides (typically less than 1 pF), in order to avoid problems with high voltage rates of change du/dt. Furthermore, this transformer should have low damping, in order to allow high data rates to be transmitted and in order to be suitable for safe isolation, SET.

One possible way to communicate via a communication interface K which is protected by such a transformer U is to use communication components based on the widely used Ethernet Standard, with the digital communication interface being designed on the basis of Ethernet physics, and with the transformer providing DC isolation for both communication paths which are provided using Ethernet physics.

A detail of one such option is shown in the illustration in FIG. 2. For this purpose, the drive electronics A and the control unit R have line drivers PL based on the Ethernet physical layer, which are operated with a suitable transmission protocol. The actual transmission takes place via the transformer U, which provides DC isolation for both communication paths.

Since, as already mentioned further above, Ethernet does not allow bidirectional transmission via one channel, two separate channels RX1 and TX1 are needed. A transformer for Ethernet which, as standard, does not ensure sufficient interference immunity against high voltage rates of change (du/dt), but which in particular does not ensure safe isolation for voltages above 720 V, is thus replaced by a transformer according to the invention. This transformer is designed such that it ensures safe DC isolation for both communication paths or channels.

When using the described Ethernet physics, there is no problem with DC components when transmitting binary data via the transformer since, according to the Ethernet Standard with the three voltage states that are provided in this standard, with a positive voltage, a negative voltage and zero volts, there is no need to be concerned about saturation states in the transformer.

One example of a suitable synchronous transmission system is a communication network based on Ethernet physics, which is strengthened by means of a suitable digital transmission protocol to form a deterministic transmission system.

Since the application illustrated in FIG. 1 generally requires not only high-precision compliance with real-time conditions but also a high level of safety in the transmission process, the standardized transmission layer 2 (message frames and access methods) for (fast) Ethernet, which does not comply with these requirements, is completely redefined, by way of example, by a new data protocol and a new access control system, and the Ethernet physics is thus used as the basis for real-time communication between, for example, drive components. The communication between the control unit R and the power section LT can be provided in this way.

With reference to synchronization between a master, for example the control unit R, and slave units, for example a number of power sections LT in a decentralized drive system, it has been found to be advantageous for the slave units to be synchronized to the master unit by using a predetermined overall cycle time via a respective timer as a clock for each slave unit, which time is set cyclically by reception of a respective slave-specific synchronization information item which is defined by the master unit.

It is thus possible to use a master-slave communication architecture. In order to make it possible to interchange data cyclically at the same sampling times, a common time base is produced for the master and for all the slaves. The slaves are synchronized to the master by specifically transmitted messages, relating to defined times, from the master to the slaves, and individually configured timers in the slaves.

In this case, payload data messages and specific synchronization messages which contain the respective synchronization information may be transmitted. Alternatively, the synchronization information may also be integrated in a transmitted payload data message.

In this case, the robustness of the communication system can be further improved if each timer in a slave unit automatically starts a new cycle, even in the absence of the respective synchronization information, once a predetermined overall cycle time has elapsed.

By way of example, a timeslot access method, which is initialized by the master in the network and allows dead-time-optimum data transmission, is used for the transmission and reception modes during cyclic data transmission. It is thus possible to precisely monitor the messages for disturbed, premature or delayed transmission.

For this purpose, only the master unit has transmission authorization on the communication path for initialization, and informs each slave unit, which only has response authorization, via an appropriate slave-specific message not only of the overall cycle time but also of the timeslots within the overall cycle time in which the respective slave unit will receive messages from the master unit, and in which timeslots it should send its messages.

In this case, it has been found to be advantageous for each slave unit to be informed of the respective synchronization time, during the initialization phase.

If instantaneous values (for example phase current actual values of a connected motor M etc.) are in each case stored relating to a common time, in particular relating to the start of a cycle, in each slave unit, that is to say the respective power section LT with its drive electronics A, it is possible to achieve simultaneous and equidistant sampling for the control unit R.

Furthermore, monitoring information which allows safety functions that are provided directly in the slave unit to be activated can be provided in each message that is transmitted from the master unit to a slave unit.

The payload data can be transported in a message frame which, in addition to slave addressing and message length information, provides protection of the data integrity by means, for example, of a CRC checksum and further safety-related data areas. The data in the message frame may be evaluated not only by an application processor, but also by a communication module COM.

For this purpose, each slave unit transmits a signal with each message to the master unit. The master unit then stops the appropriate slave unit in a controlled manner if this signal is absent.

Although the transmission technique based on the Ethernet Standard principle that is used allows only point-to-point connections, the use of network nodes (so-called hubs) as in (fast) Ethernet networks allows the formation of networks, with a number of communication subscribers or each communication subscriber having a circuit part for forming network nodes, which is used for passing on messages in the direction of another master unit or further slave units with communication between communications subscribers via network nodes likewise taking place using the procedure described above. According to the invention, each communication interface K is then safely electrically isolated from the high-voltage side of the power section LT by means of suitable transformer U.

Real-time communication can be achieved on the basis of a communication system using Ethernet physics with the aid of the procedure described above. In this case, hierarchical networks can also be produced, with point-to-point connections (connected via network nodes) using Ethernet physics for carrying out real-time communication in relatively large network topologies.

Communication networks other than those described by way of example above may, of course, also be used to provide the safe electrical isolation SET between the power sections LT according to the invention and to provide for the networking with a control unit R, provided that the bandwidth on the transmission ensures communication at the current regulation clock rate.

In this case, it is important to note that coding without any DC component is carried out first of all for use of a transformer even with other digital communication methods, with one possibility here being, by way of example, Manchester coding. This makes it possible to avoid what amounts effectively to a DC voltage being applied to the transformer U (which cannot process this DC voltage) as a result of a sequence of a number of identical binary values.

For this purpose, encoders/decoders EC_DC are in each case provided both in the control unit R and in the drive electronics A, that is to say at both ends of the communication path, in the drive control system shown in FIG. 1. This results in data being coded without any DC component, for example being Manchester-coded, and being available as coded data.

A large number of other possible codings can of course likewise be used, provided that they allow signal transmission without any DC component.

A further exemplary embodiment allows transmission of synchronous data, with the signals being suitably coded in order to avoid the production of DC components, by EXOR-linking of the clock signal and data.

To do this, two data streams must be transmitted, namely a data signal and the clock signal which is required for synchronous transmission. Two communication paths are therefore provided, which are protected by one transformer, in a similar manner to that shown in FIG. 2, with safe DC isolation.

Initially, the data signal may have a DC component. In order to allow it to be transmitted by a transformer despite this, it is first of all exclusive-OR or EXOR-linked to the clock signal. This results in a coded data signal. The clock signal can be EXOR-linked with a constant binary value such as "zero" in order to avoid different delay times.

The logical linking of the data signal and clock signal thus ensures that a coded data signal without any DC component can be transmitted via the transformer U. The clock signal itself never has any DC components.

Both coded signals are then transmitted via the respective communication path, and the original data stream is recovered by once again EXOR-linking the two coded signals. In order to recover the original clock signal, this is once again EXOR-linked to the constant binary value.

The data signal and the clock signal may, of course, be logically linked in other possible ways which allow the data signal to be transmitted without any DC component. The EXOR-linking as explained above is distinguished by its particularly simple and effective implementation for the invention.

The invention claimed is:

1. A drive control system for an electrical drive, comprising:
  a power section which is at a comparatively high electrical potential;
  a drive electronics which supplies the power section with a plurality of drive signals and receives a plurality of phase current actual values from the power section;
  a digital communications interface;

a control unit which is at a comparatively low electrical potential and is operatively connected to the drive electronics via the communications interface; and an electric transformer, disposed in the communications interface, for implementing a DC isolation between the comparatively high electrical potential of the power section and the comparatively low electrical potential of the control unit.

2. The drive control system of claim 1, wherein the transformer is integrated in the drive electronics.

3. The drive control system of claim 1, wherein the transformer is integrated in the control unit.

4. The drive control system of claim 1, wherein the electrical transformer is constructed to ensure a DC isolation which complies with requirements for a safe electrical isolation.

5. The drive control system of claim 1, wherein the communications interface is designed on the basis of an Ethernet physics, with the electrical transformer providing DC isolation for a plurality of communication paths which are provided using Ethernet physics.

6. The drive control system of claim 1, wherein the communications interface uses a serial communication interface for transmission.

7. The drive control system of claim 1, wherein the communications interface uses a half-duplex mode transmission method.

8. The drive control system of claim 1, and further comprising a coder provided for encoding a binary data stream to create a coded data stream without any DC component for transmission to the electrical transformer, and a decoder receiving the data stream via the electrical transformer for decoding the data stream.

9. The drive control system of claim 8, wherein the coder produces synthetic signal changes through transmission of binary values of the data stream as a defined sequence of signal changes, and the decoder recovers Previously presented binary values of the data stream by associating pertaining binary values with the sequences of signal changes which arrive at the decoder.

10. The drive control system of claim 8, wherein the coder and the decoder use Manchester coding.

11. The drive control system of claim 8, wherein the digital communications interface is a synchronous digital communications interface between the control unit and the drive electronics using a data signal and a clock signal.

12. The drive control system of claim 11, wherein the communications interface has a first communication path and a second communication path, wherein the coder logically links the data signal and the clock signal as to provide an encoded data signal without any DC component which is transmittable via the first communication path, and wherein the clock signal is transmitted via the second communication path, said electrical transformer being so designed as to provide DC isolation for both communication paths, with the decoder configured for recovering the data signal by logically linking the coded data signal and the clock signal.

13. The drive control system of claim 12, and further comprising means for coding and decoding of the clock signal by using a same logical linking with a constant binary value, wherein the coded clock signal is transmittable via the second communication path.

14. The drive control system of claim 12, wherein the coder is constructed for exclusive-OR linking of the data signal and the clock signal when transmitting and wherein the decoder is constructed for deciphering a renewed exclusive-OR linking of the coded data signal and the clock signal during reception.

15. The drive control system of claim 14, wherein the coder is constructed for exclusive-OR linking of the clock signal with a constant binary value, when transmitting, with the thus coded clock signal transmittable via the second communication path, and wherein the decoder is constructed for deciphering a renewed exclusive-OR linking of coded data signals and same constant binary value during reception.

16. The drive control system of claim 15, wherein the binary value is zero.

17. The drive control system of claim 1, wherein the electrical transformer has a primary circuit and a secondary circuit, with a low coupling capacitance between the primary circuit and the secondary circuit.

18. The drive control system of claim 17, wherein the coupling capacitance is less than 1 pF.

19. The drive control system of claim 1, wherein the electrical transformer is constructed to have a low damping feature.

20. The drive control system of claim 12, and further comprising means for coding and decoding of a common-time value stored by components of the drive control system to create a coded data stream for transmission to the electrical transformer, and a decoder receiving the data stream from the electrical transformer for decoding the data stream.

21. The drive control system of claim 20, wherein the common-time values are time values set cyclically by the reception of a synchronization information data item.

22. The drive control system of claim 20, wherein the instantaneous values are set initially and a predetermined cycle time is used to transmit data items.

* * * * *